US006875700B2

(12) United States Patent
Kanakasabapathy et al.

(10) Patent No.: US 6,875,700 B2
(45) Date of Patent: Apr. 5, 2005

(54) ION-ION PLASMA PROCESSING WITH BIAS MODULATION SYNCHRONIZED TO TIME-MODULATED DISCHARGES

(75) Inventors: Sivananda K. Kanakasabapathy, Richardson, TX (US); Lawrence J. Overzet, Plano, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 72 days.

(21) Appl. No.: 09/820,244

(22) Filed: Mar. 28, 2001

(65) Prior Publication Data

US 2002/0139658 A1 Oct. 3, 2002

Related U.S. Application Data

(60) Provisional application No. 60/228,705, filed on Aug. 29, 2000.

(51) Int. Cl.[7] .............................................. H01L 21/302
(52) U.S. Cl. ...................... 438/710; 438/706; 438/712; 216/67
(58) Field of Search ................................. 438/706, 710, 438/712, 720; 156/345, 345.43, 345.44, 345.45; 216/58, 67, 69, 71

(56) References Cited

U.S. PATENT DOCUMENTS

| | | | |
|---|---|---|---|
| 4,747,922 A | 5/1988 | Sharp | 204/192.11 |
| 4,963,239 A | 10/1990 | Shimamura et al. | 204/192.12 |
| 5,423,915 A | 6/1995 | Murata et al. | 118/723 |
| 5,435,886 A | 7/1995 | Fujiwara et al. | 156/643 |
| 5,436,172 A | 7/1995 | Moslehi | 437/8 |
| 5,453,305 A | 9/1995 | Lee | 427/562 |
| 5,467,013 A | 11/1995 | Williams et al. | 324/127 |
| 5,472,561 A | 12/1995 | Williams et al. | 156/627 |
| 5,510,011 A | 4/1996 | Okamura et al. | 204/192.3 |
| 5,540,824 A | 7/1996 | Yin et al. | 156/345 |
| 5,554,853 A | 9/1996 | Rose | 250/492 |
| 5,558,718 A | 9/1996 | Leung | 118/723 |
| 5,580,419 A | 12/1996 | Berenz | 156/628 |
| 5,580,429 A | 12/1996 | Chan et al. | 204/192 |
| 5,607,509 A | 3/1997 | Schumacher et al. | 118/723 |
| 5,619,103 A | 4/1997 | Tobin et al. | 315/111 |
| 5,650,032 A | 7/1997 | Keller et al. | 156/345 |
| 5,683,548 A | 11/1997 | Hartig et al. | 156/643 |
| 5,728,261 A | 3/1998 | Wolfe et al. | 156/662.1 |
| 5,744,011 A * | 4/1998 | Okubo et al. | 204/192.12 |
| 5,783,102 A | 7/1998 | Keller | 216/68 |
| 5,827,435 A | 10/1998 | Samukawa | 216/69 |
| 5,846,375 A | 12/1998 | Gilchrist et al. | 156/345 |
| 5,868,897 A | 2/1999 | Ohkawa | 156/345 |
| 5,968,377 A | 10/1999 | Yuasa et al. | 219/121.41 |
| 5,983,828 A | 11/1999 | Savas | 118/723 I |
| 6,028,285 A | 2/2000 | Khater et al. | 219/121 |
| 6,335,535 B1 * | 1/2002 | Miyake et al. | 250/492.21 |
| 6,436,304 B1 * | 8/2002 | Nogami | 216/79 |

OTHER PUBLICATIONS

Kanakasabapathy, Sivananda K., Overzet, Lawrence J., and Midha, Vikas and Economou, Demetre Alternating Fluxes of Positive and Negative Ions from Ion–Ion Plasma, University of Texas at Dallas, and University of Houston, 2000, pp. 1–8 and figures 1–3.

Koromogawa, Takashi, Fujii, Takashi, Yamashita, Akihito, Horiike, Yasuhiro, and Shindo, Haruo, Negative Ion Assisted Silicon Oxidation in Downstream of Microwave Plasma, Tokai University, Hiratsuka, Japan and Toyo University, Kawagoe, Japan, 1998 Publication Board, Japanese Journal of Applied Physics, Part 1, No. 9A, Sep. 1998, Jpn. J. Appl. Phys. vol. 37 (1998) pp5028–5032.

(Continued)

*Primary Examiner*—Lan Vinh
(74) *Attorney, Agent, or Firm*—Gardere Wynne Sewell LLP

(57) ABSTRACT

A system for plasma processing using electron-free ion-ion plasmas, wherein the substrate bias waveform is synched to a pulsed RF drive. A delay is included between the end of an RF drive pulse and the start of a bias pulse, to allow the electron population to drop to approximately zero. By using a source gas mixture which has highly electronegative components, substrate bombardment with negative ions can be achieved.

32 Claims, 14 Drawing Sheets

OTHER PUBLICATIONS

Samukawa, Seiji, Highly Selective and Highly Anisotropic SiO$_2$ Etching in Pulse–Time Modulated Electron Cyclotron Resonance Plasma, NEC Corporation, Ibaraki, Japan, Part 1, No. 48, Apr. 1994, Jpn. J. Appl. Phys. vol. 33 (1994) pp2133–2138.

Ohtake, Hiroto and Samukawa, Seiji, Charge–free etching process using positive and negative ions in pulse–time modulated electron cyclotron resonance plasma with low–frequency bias, NEC Corporation, Ibaraki, Japan Appl. Phys. Lett. 68 (17), Apr. 22, 1996, pp2416–2417.

Ahn, Tae Hyuk, Nakamura, Keiji and Sugai, Hideo, A New Technology for Negative Ion Detection and the Rapid Electron Cooling in a Pusled High–Density Etching Plasma, Nagoya University, Nagoya, Japan, Part 2, No. 108, Oct. 15, 1995, Jpn. J. Appl. Phys. vol. 34 (1995) ppL1405–L1408.

Hashimoto, Koichi, Hikosaka, Yukinobu, Hasegawa, Akihiro and Nakamura, Moritaka, Reduction of Electron Shading Damage Using Synchronous Bias in Pulsed Plasma, Fujitsu Limited, Kawaski, Japan, Part 1, No. 6A, Jun. 1996, Jpn. Appl. Phys. vol. 35 (1996) pp3363–3368.

Overzet, L.J. and Luo, L., Negative and positive ions from radio frequency plasmas in boron trichloride, University of Texas at Dallas, Appl. Phys. Lett. 59 (2), Jul. 8, 1991, pp161–163.

Samukawa, Seiji and Terada, Kazuo, Pulse–time modulated electron cyclotron resonance plasma etching for highly selective, highly anistropic, and less–charging polycrystalline silicon patterning, NEC Corporation, Ibaraki, Japan, J. Vac. Sci. technol. B 12(6), Nov./Dec. 1994, pp3300–3305.

Samukawa, Seji, Pulse–time modulated electron cyclotron resonance plasma etching with low radio–frequency substrate bias, NEC Corporation, Ibaraki, Japan, Appl. Phys. Lett., vol. 68, No. 3, Jan. 15, 1996, pp316–318.

Overzet, L.J., Beberman, J.H. and Verdeyen, J.T., Enhancement of negative ion flux surfaces from radio–frequency processing discharges, University of Illinois, J. Appl. Phys. 66 (4), Aug. 15, 1989, pp. 1622–1631.

* cited by examiner

Figure 10: Testing results for a specific embodiment of the invented technique.

Figure 11: Testing results for a specific embodiment of the invented technique.

Figure 13    Plasma Reactor and Bias Synchronization schematics of a specific embodiment of the invention.

ION-ION PLASMA PROCESSING WITH BIAS MODULATION SYNCHRONIZED TO TIME-MODULATED DISCHARGES

CROSS-REFERENCE TO OTHER APPLICATION

This application claims priority from U.S. application 60/228,705, filed Aug. 29, 2000, which is hereby incorporated by reference.

BACKGROUND AND SUMMARY OF THE INVENTION

The present invention relates to plasma processing methods and systems, and particularly to processing with electron-free ion-ion plasmas in proximity to a microelectronic wafer surface.

"Plasma" is a state of matter that includes a significant number of free charges (ions and/or electrons). Useful plasmas are often gaseous, but the presence of free charge causes plasmas to behave very differently from neutral gases.

Plasma processing is one of the core technologies of the microelectronics industry. It is used for several functions, e.g. to deposit materials onto substrates, etch material from substrates, and to clean and/or chemically change a surface. Such plasmas are usually plasmas of the "glow discharge" type. (There are many other types of plasmas, ranging over a vast range of density and temperature, which are not relevant to such glow discharge plasmas.)

The plasma is usually formed by applying electromagnetic power to a neutral gas near the material surface (substrate) to be processed. Such a plasma will include free electrons, positive ions, and possibly also (depending on the gases used) a significant fraction of negative ions. The ions and neutral gas molecules can contribute to processing the surface.

The behavior of free electrons in a plasma is very different from that of ions. The basic reason for this is that typical ions have more than 10,000 times as much mass as an electron, while having the same magnitude of charge. (The sign of the ion charge can be either positive or negative.)

One result of this is that the electromagnetic power input to form the plasma is mostly coupled to electrons. These then transfer the energy to ions and molecules in collisions. If the electron population becomes very low, it will become more difficult to couple power into the plasma. Thus, it is difficult to maintain plasma without electrons. Without electrons the positive and negative ions will generally be lost faster than they can be produced, and the plasma will decay (or "quench") to become simply a neutral gas. In practice, useful electron-free ion-ion plasmas cannot presently be generated directly, i.e. cannot be generated without use of an electron-ion plasma at some point. Ion-ion plasmas presently have to be produced as either a spatial or a temporal decay of electron-ion plasma.

Another difference between the behavior of ions and electrons in a plasma is that the velocity of electrons is typically very much larger. Thus, the electron current density is also very much larger.

A further consequence of this is that the potential of the plasma center is ordinarily more positive than that on any surface (or walls) in contact with the plasma. This potential difference between the plasma center and any surface helps prevent further electron escape and promotes positive ion escape. The potential difference is concentrated in a "sheath" region near all surfaces (and walls). Any positive ions that enter the "sheath" region are accelerated directly into the surface with a velocity that is largely perpendicular to the surface. By contrast, the electrons that enter the sheath region are repelled, and the few that make it to the surface will have an isotropic velocity distribution there. This results in a phenomenon commonly called "electron shading."

Electron shading is caused by the different behavior of electrons and ions crossing the sheath. Positive ions obtain a directed motion during their traverse of the sheath, and so relatively more of their positive charge is deposited at the bottom of high aspect ratio features; but electrons retain their isotropic velocity distribution, and so relatively more of their negative charge is deposited near the top of high aspect ratio features. The resulting charge separation is believed to modify the trajectories of subsequent ions, and to cause significant problems such as: lateral etching (notching), trenching, bowing, and dielectric breakdown.

A further consequence of the larger current carrying capability of electrons is the formation of a DC offset voltage on surfaces driven with AC voltages. This DC voltage is called the "DC bias" and forms, on surfaces driven with AC voltage, to ensure equal time-averaged positive and negative charge currents. (That is to say, to ensure that no net charging of the surface occurs during an RF period in quasi-steady state.) It is well known to those skilled in the art and often used to accelerate positive ions into a processing surface. It also repels negative ions and electrons from the processing surface. It is difficult to quickly change the DC-bias once it has formed and consequently, the DC-bias on a wafer surface can often remain for extended periods after the plasma has been extinguished.

Finding a method to bring electrons to the bottom of high-aspect-ratio features could remove this charge imbalance and improve plasma-etch performance. This has been tried with some success. For example, Hashimoto et al., 35 Jpn. J. Appl. Phys., Part 1, 3363 (1996) described a method of bringing cool electrons in the afterglow to a processing surface from an argon plasma. The idea was to allow electrons to cool in the afterglow of a plasma so that the sheath potential and size decreases, the plasma expands closer to the wafer surface and thus better neutralizes the accumulated surface charge from the active glow. Of course, electrons do not etch the surface so etch rates suffer some.

Ion-ion plasmas can be biased to extract either positive or negative ions. The nearly equal masses of positive and negative ions makes for a nearly symmetric current voltage characteristic of this plasma, and easily allows one to invert the ordinary sheath fields thereby accelerating either positive or negative ions into a processing surface. If an alternating current (AC) bias is applied, both positive and negative ions can be accelerated into the surface in an alternating fashion. The result is a process whereby the charge to the surface balances (balanced charge processing) and as a result, the surface is not significantly charged by the impinging ions. This is evidenced by the fact that virtually no DC-bias forms when processing using ion-ion plasma even in highly asymmetric reactors. Alternating fluxes of positive and negative ions is only possible from ion-ion plasma, at present, so biasing during the active glow (the electron-ion plasma phase) doesn't gain one a significant advantage in terms of balancing charge. Indeed, an AC bias on the surface during the electron-ion phase will form a DC bias that will act to prevent balanced charge processing during the ion-ion plasma. This is an important difference between the present invention and the disclosure of Savas described in U.S. Pat. No. 5,983,828. Savas describes using a continuous low frequency substrate bias to alternately accelerate positive and negative ions to the substrate. His description is flawed, however in that it never describes a synchronization of the substrate bias pulsing to the high and low power cycles of the plasma power. As a result, a DC Bias forms when using his method that very effectively prevents negative ions from reaching the processing substrate. The present invention describes a method that prevents a DC Bias from forming and that ensures alternating positive and negative ion bombardment of the substrate with full control over the ion energies.

Some plasma processing units have used "downstream" configurations, in which a plasma discharge is physically separated from the substrate being treated. By placing the substrate downstream from the plasma discharge, with a physical separation of e.g. several tens of centimeters, the gas flow can be given an "afterglow" like condition, i.e. can contain a significant population of negative ions. In such techniques the electron population can be very low at the point where the gas flow encounters the substrate. However, these techniques are different from the ion-ion plasma techniques used in the present application, in that the reduction in electron density is largely due to diffusion rather than attachment. This leads to reduced density of ions at the wafer surface as ions are lost to diffusion as well, which may be undesirable. By contrast, pulsed-plasma afterglow techniques can provide a much higher density of ionized species in proximity to the wafer surface.

Ion-Ion Plasma Processing with Bias Modulation Synchronized to Time-Modulated Discharges The present application discloses a new approach to plasma processing. Modulated bias voltage is synchronized with pulsed plasma generation, with a time delay during which the electron population falls to an insignificant level. This permits processing with a pure ion-ion plasma.

The disclosed ion-ion systems and methods can produce alternating bombardment of a processing substrate by positive and negative ions, such that the charges of the ions balance and the substrate never endures any significant charge buildup. Such methods, in various embodiments, can be used to process materials with high aspect ratio features without the deleterious "electron shading" effects common in present technology. It can allow the user to vary the surface chemistry in novel and beneficial fashions. It can also provide significantly better control over ion energies.

The disclosed innovations, in various embodiments, provide one or more of at least the following advantages:

complete control over ion bombardment energy;

reduced risk of charging up;

maximal etch efficiency, especially in the fraction of available electron-free plasma time during which ion bombardment actually occurs;

capability to combine positive-ion and negative-ion bombardment; and capability to combine maximal etch rate with minimal electron impingement.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
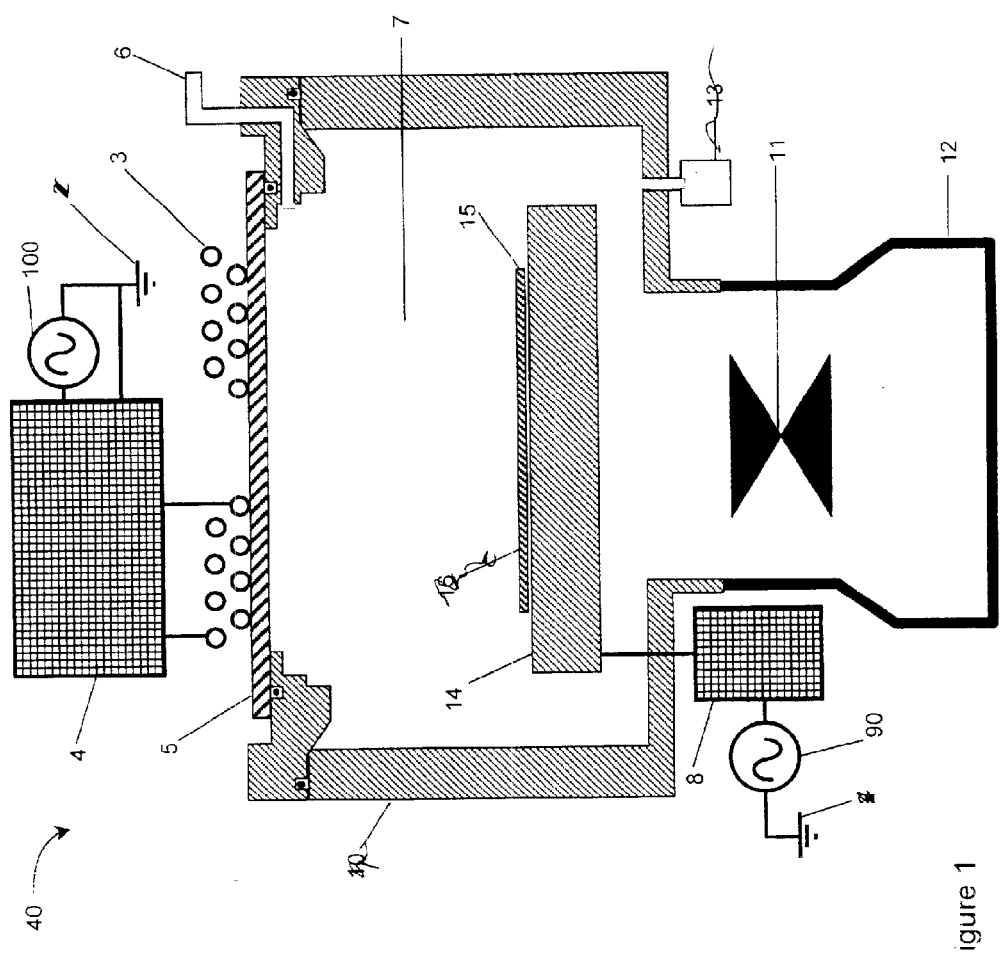
FIG. 1 illustrates a wafer processing system according to a first embodiment of the present invention.

The numerous innovative teachings of the present application will be described with particular reference to the presently preferred embodiment (by way of example, and not of limitation). The following description is intended to enable any person skilled in the art to make and use the invention. Any descriptions of specific applications are provided only as examples. Various modifications to the preferred embodiment will be readily apparent to those skilled in the art and the generic principles described herein may be applied to other embodiments and/or applications without departing from the scope of the invention.

Aspects of the present invention provide an improved plasma processing method that, in various embodiments, provide one or more of the following advantages: elimination of substrate charging during processing; improved control over ion energies; the capability to alternate positive-ion and negative-ion bombardment of a substrate; the capability to control surface chemistry through the selection of the positive and negative ion bombardment ratios; and the capability to maximize processing rate while minimizing electron bombardment.

The present application discloses a method of processing using ion-ion plasma. Pulsing the power supply used to generate plasma (the plasma source) between high power and low power cycles allows ion-ion plasma to form during the low power cycles. Usually, the low power cycles must involve little or nominally zero power to the plasma source for ion-ion plasma to form. During the low power cycles, the electrons in the plasma attach to electronegative molecules and form negative ions, producing plasma with ion densities at least 200 times greater than the electron density. Because of the small electron density, ions become the primary current carrying particles during the ion-ion plasma. Because positive and negative ions have similar masses, the sheath in front of a processing substrate can be controlled in a fashion not possible while electrons have a larger fractional density in the plasma. In particular, the sheath potential can be made either positive or negative, and can therefore accelerate either negative-ions or positive-ions into the processing substrate with nearly equal efficiency. Further, this sheath potential can be controlled without forming a DC bias, and can be as high as several hundred volts (positive or negative) without destroying the ion-ion plasma through creating electrons. While electrons are present, the sheath will only have a positive potential that accelerates only positive ions into the processing substrate.

The power supply connected to the processing substrate produces a voltage on the substrate used to accelerate ions into the processing surface and not to generate plasma. This power supply is called the substrate voltage supply and it is limited to several hundred volts peak before it begins to generate plasma in addition to accelerating ions. Like the plasma source, it is amplitude modulated to have high power and low power cycles. The amplitude modulation envelope of the substrate voltage supply is synchronized to the amplitude modulation envelope of the plasma source and phase-locked to the ion-ion plasma portion of the afterglow. The high power periods of the substrate voltage supply are limited to the period of time when ion-ion plasma exists by introducing a time delay between when the low power period of the plasma source begins and the high power period of the substrate voltage supply begins. This time delay must be determined for a given plasma condition and is inserted to allow the electron population to reduce to an insignificant level by attachment before the substrate voltage supply goes to high power. This permits processing with pure ion-ion plasma and prevents the formation of any DC bias voltage.

FIG. 1 shows a simple example of a plasma reactor 40 in which various disclosed methods can be implemented. A first RF power supply 100 is connected, through matching network 2, to drive a coil 3. The coil 3 is coupled through a window 5 (and optionally a Faraday shield, not shown) to the chamber 7. Source gasses are fed through inlet 6, and exhausted past throttling valve 11 to manifold 12. A second RF power supply, 90 is coupled, through its own matching network 8, to drive the wafer chuck 14, on which a substrate 15 can be positioned for processing.

Figure 2:
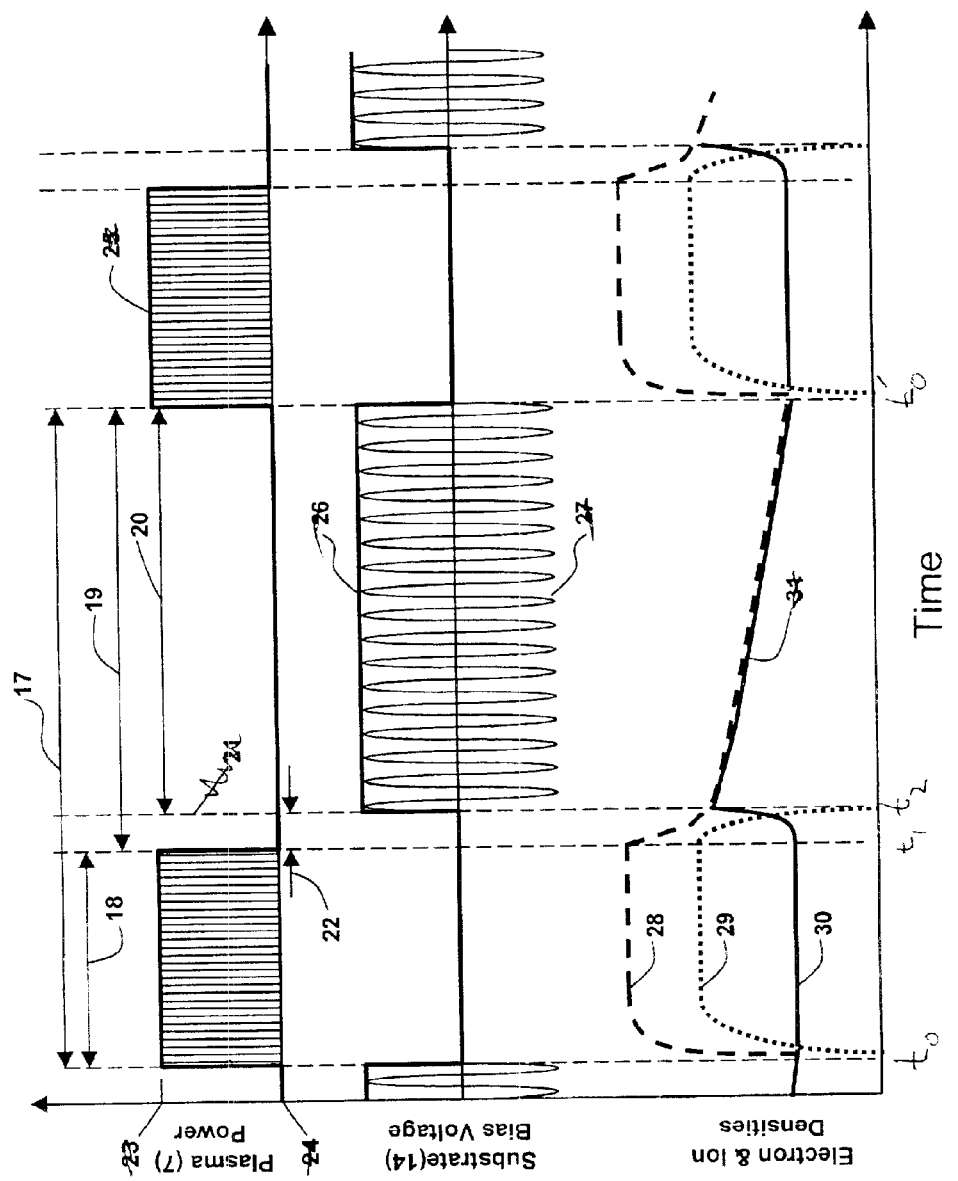
FIG. 2 illustrates the timing relationships between the plasma source power-supply output, the substrate voltage waveform and the plasma parameters (electron and ion densities) according to the first embodiment.

FIG. 2 shows timing relations in a sample embodiment. A pulse of drive power is applied to the coil at time $t_0$, to ignite the plasma, and terminated at time $t_1$. (The delay 18, from t0 to t1, needs to be enough to achieve reliable ignition and stabilization of the plasma on every cycle.) A delay 22 then follows, from time $t_1$ to time $t_2$, while the electron density 29 drops to less than 0.5% of the ion density. (During this time the negative ion density 30 increases, as a result of attachment.) At time $t_2$ an AC bias voltage is applied to substrate 14, to induce ion bombardment and produce the desired surface modifications to the substrate. (Note that since the electron density is essentially zero during this time, the positive and negative ion charge densities will be equal.) Once the ion densities have declined to the point where the desired reaction (etching or other) has slowed or stopped, a new pulse of drive power is applied (at time $t_0'$). Thus the pulse period is 17, i.e. the time from $t_0$ to $t_0'$. Note also that the duty cycle of the power pulses is preferably less than 50%, i.e. off tim 19 is greater than on time 18.

Figure 3:
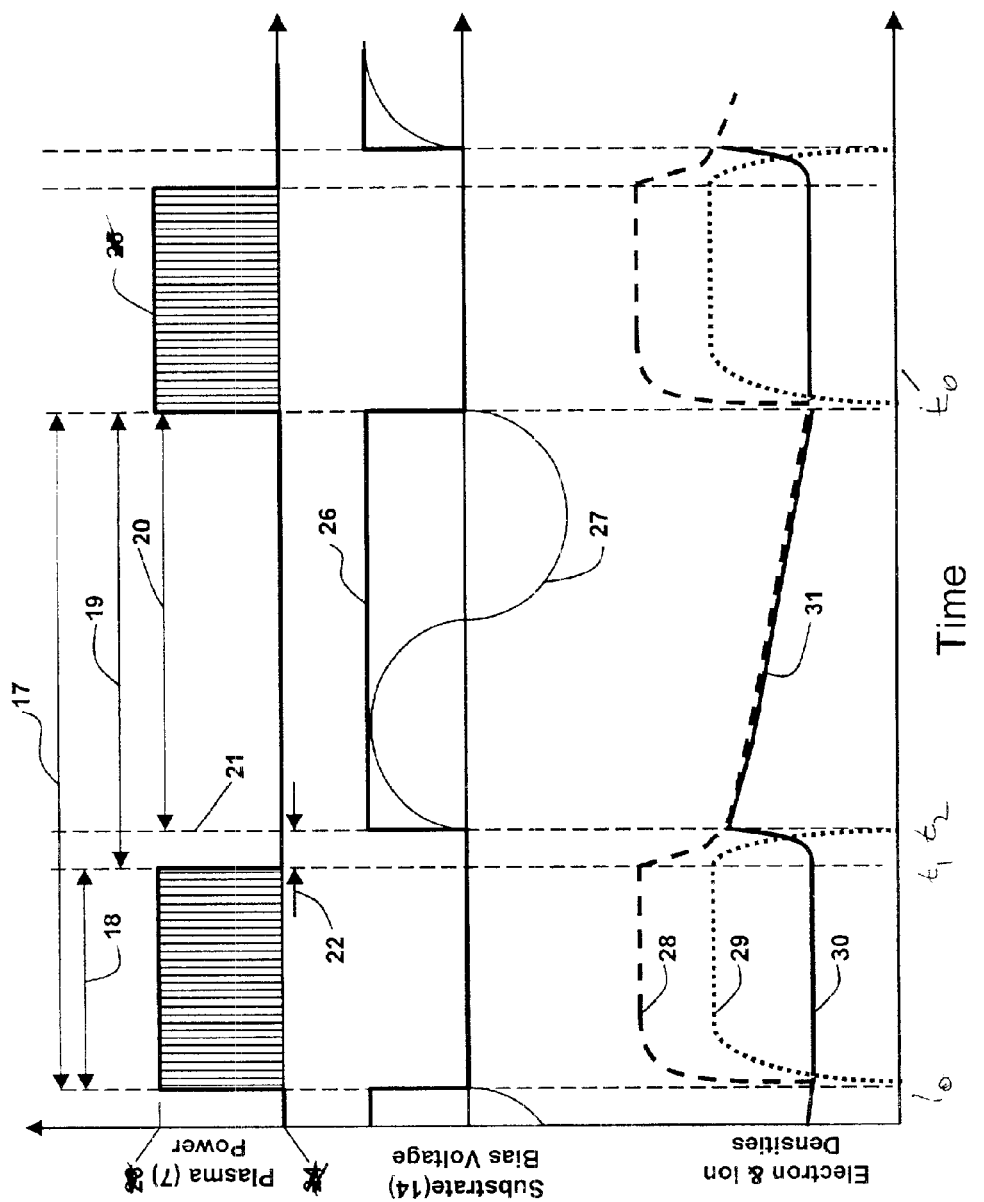
FIG. 3 illustrates the timing relationships for an alternate substrate voltage waveform at a much lower frequency.

In the example of FIG. 2, the AC bias was at a lower frequency than the drive power; FIG. 3 shows an example where the frequency of AC bias is lower yet, to the point where only one full cycle of the AC bias signal 27 occurs during the high state of the control pulse 26.

Figure 4:
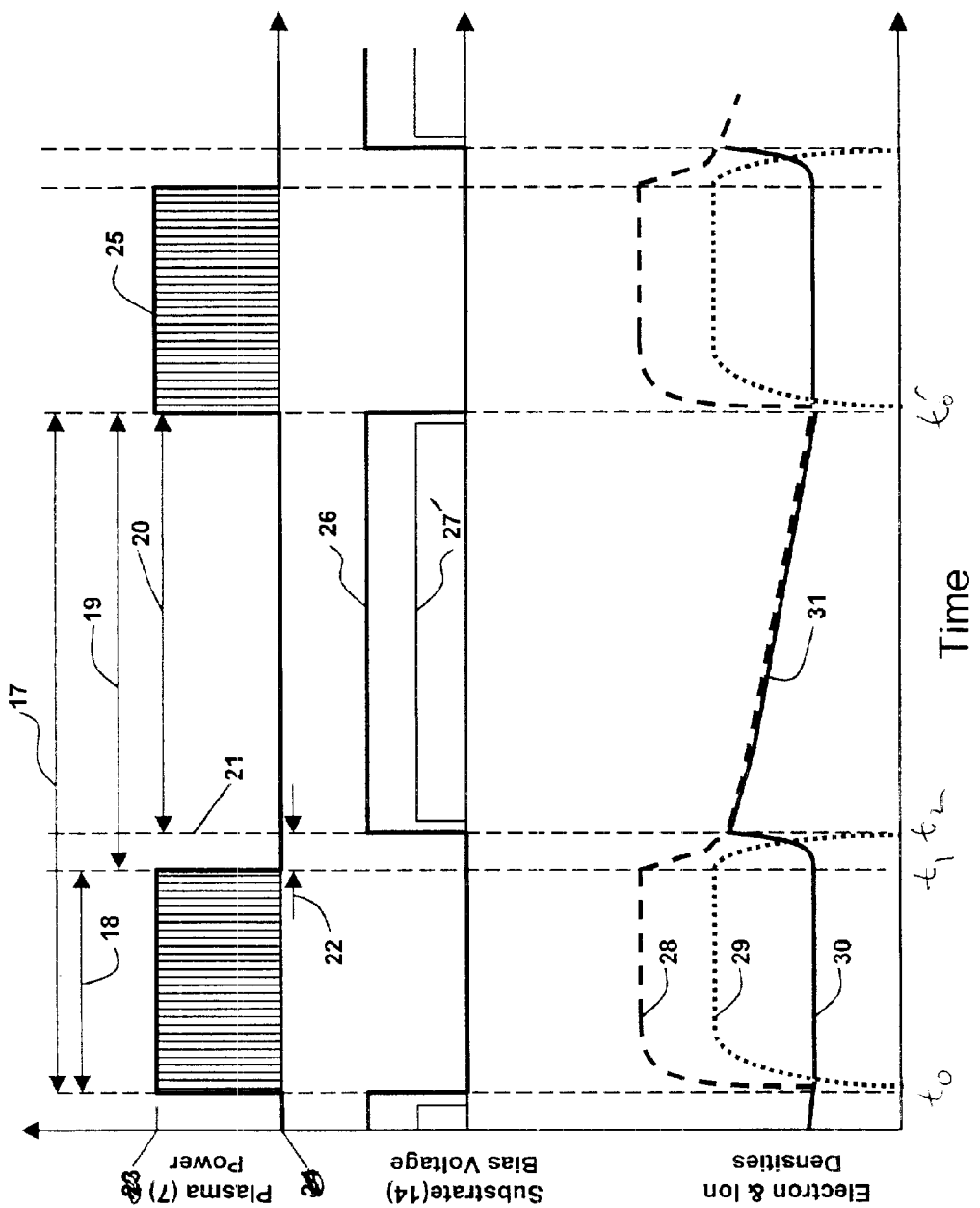
FIG. 4 illustrates the timing relationships for an alternate substrate voltage waveform that only attracts negative ions.

FIG. 4 shows yet another embodiment, where a DC bias signal 27' (still controlled by the control pulse 26) is used instead of the AC bias signal 27.

Figure 5:
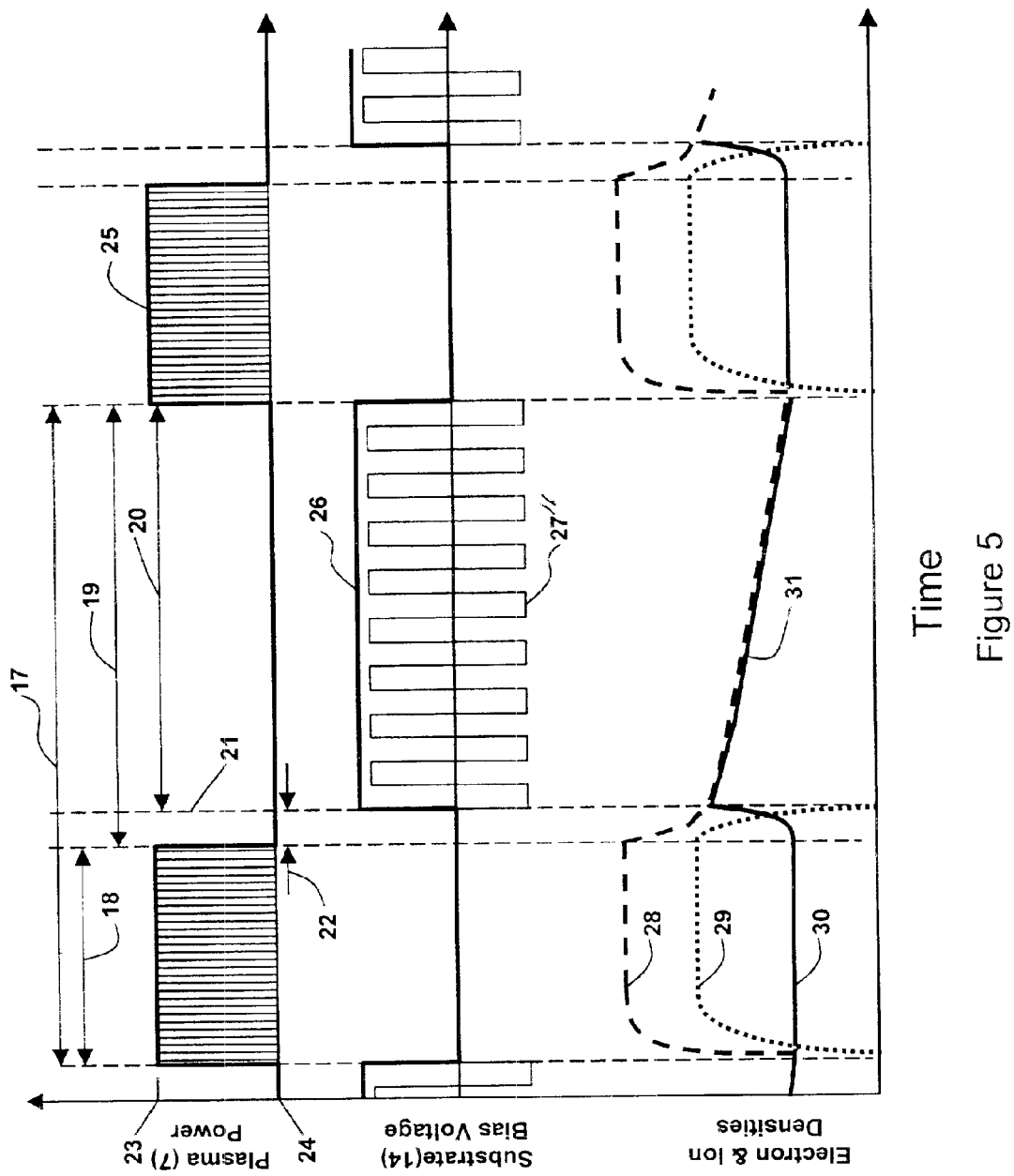
FIG. 5 illustrates the timing relationships for an alternate substrate voltage waveform that attracts positive and negative ions at nearly constant energies.

FIG. 5 shows a different embodiment, where the control pulse 26 gates a square wave signal 27".

Figure 6:
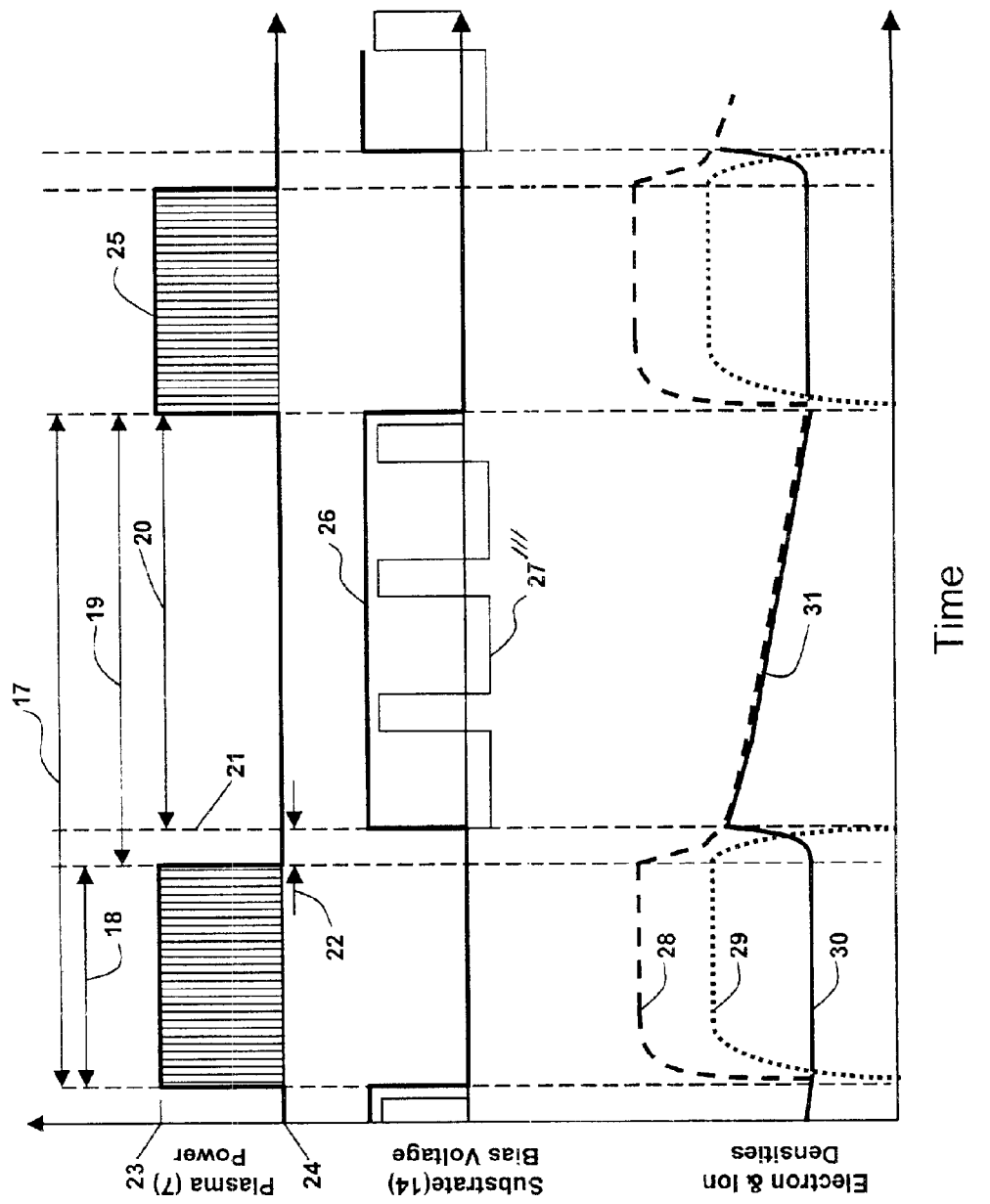
FIG. 6 illustrates the timing relationships for an alternate substrate voltage waveform that accelerates negative ions to much larger energies than positive ions and positive ions for a longer period of time than negative ions.

FIG. 6 shows a different embodiment, where the control pulse 26 gates an asymmetrical signal 27'''.

Figure 7:
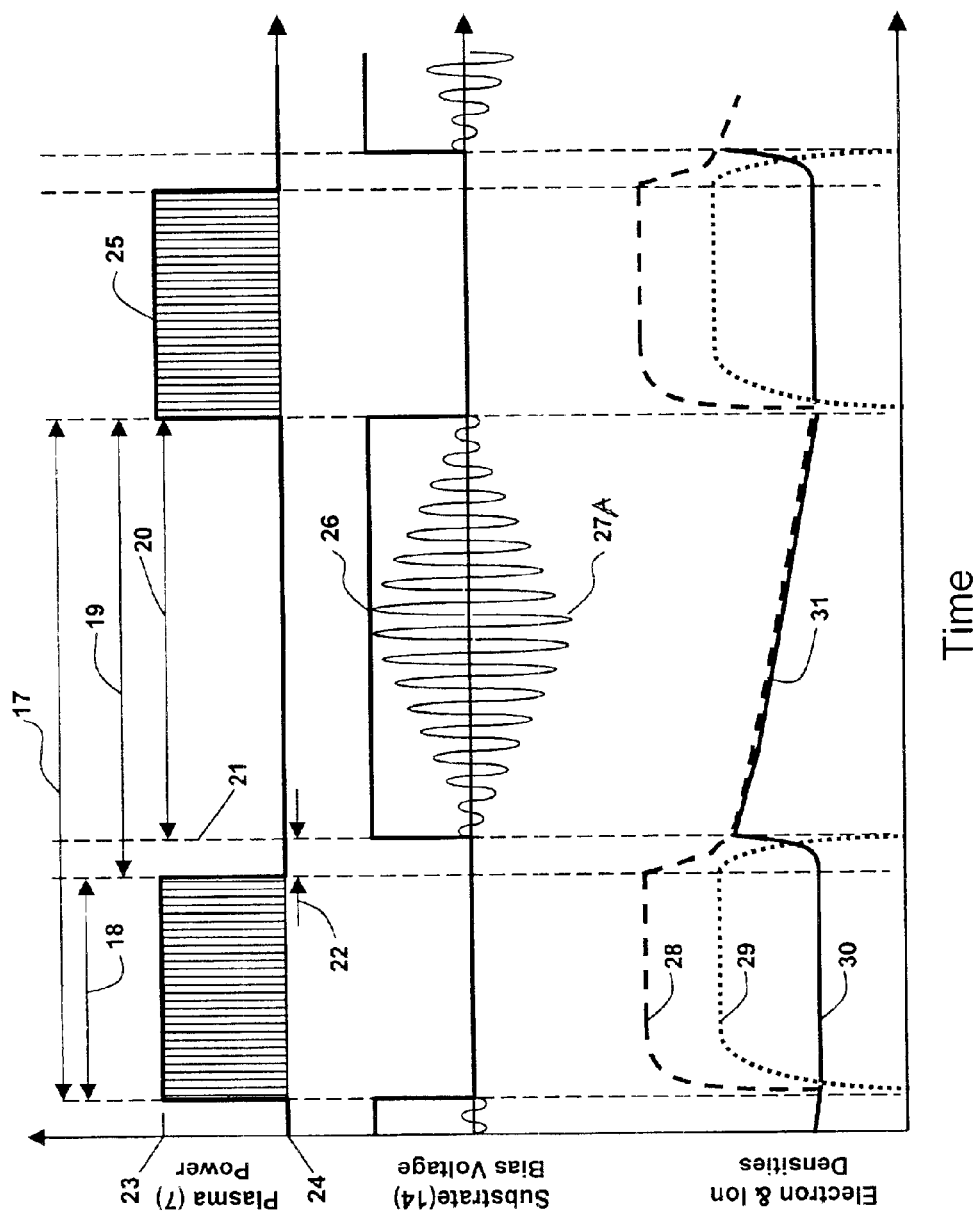
FIG. 7 illustrates the timing relationships for an alternate substrate voltage waveform that has a triangle wave amplitude modulation during the ion-ion plasma.

FIG. 7 shows a different embodiment, where the control pulse 26 gates a ramped bias signal 27A. In this embodiment the time constants are selected so that ramp-down occurs during the duration of the control pulse 26, but of course this can be varied.

Figure 8:
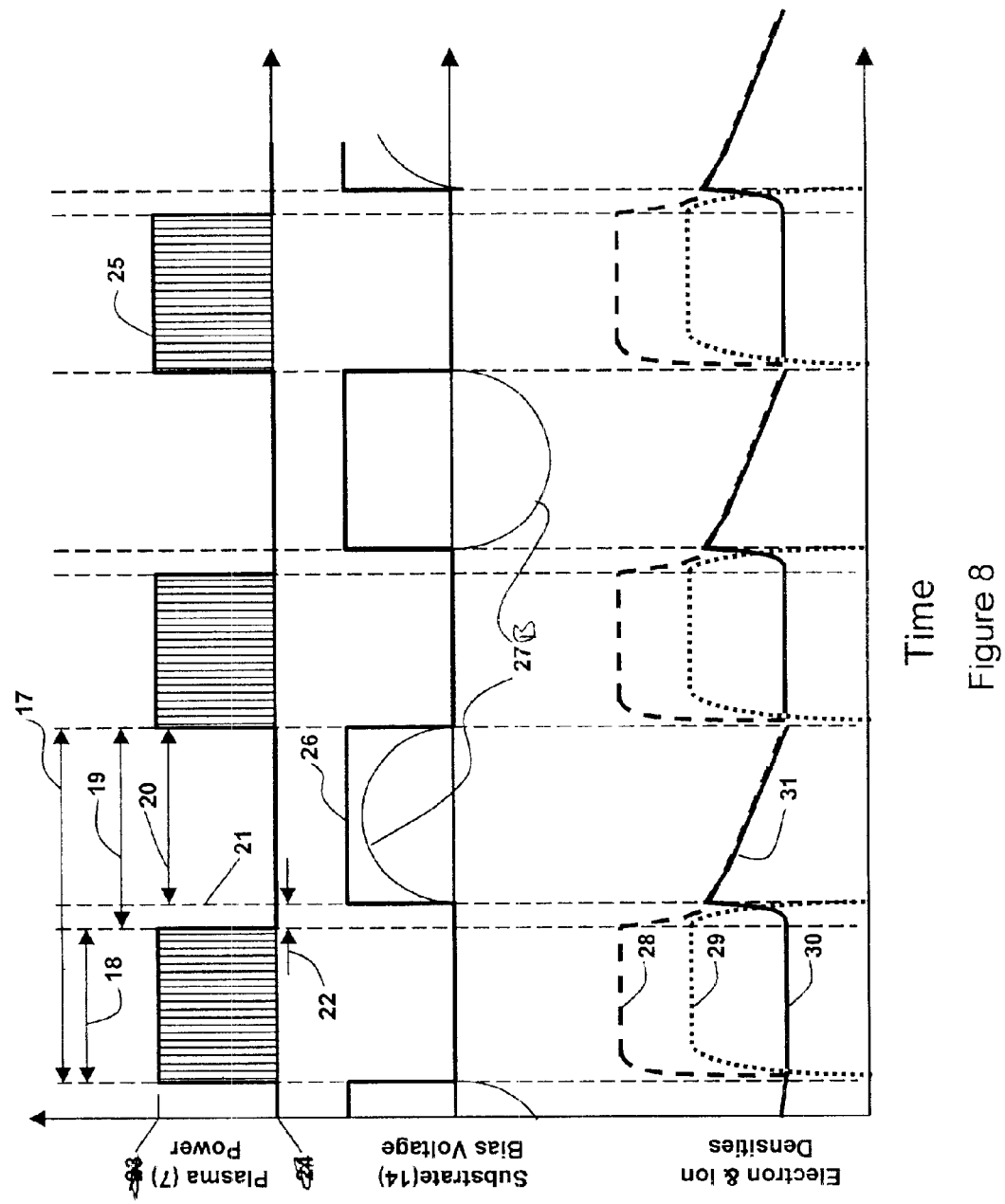
FIG. 8 illustrates the timing relationships for an alternate substrate voltage waveform that attracts negative ions during one ion-ion plasma and positive ions during the next ion-ion plasma period.
Figure 9:
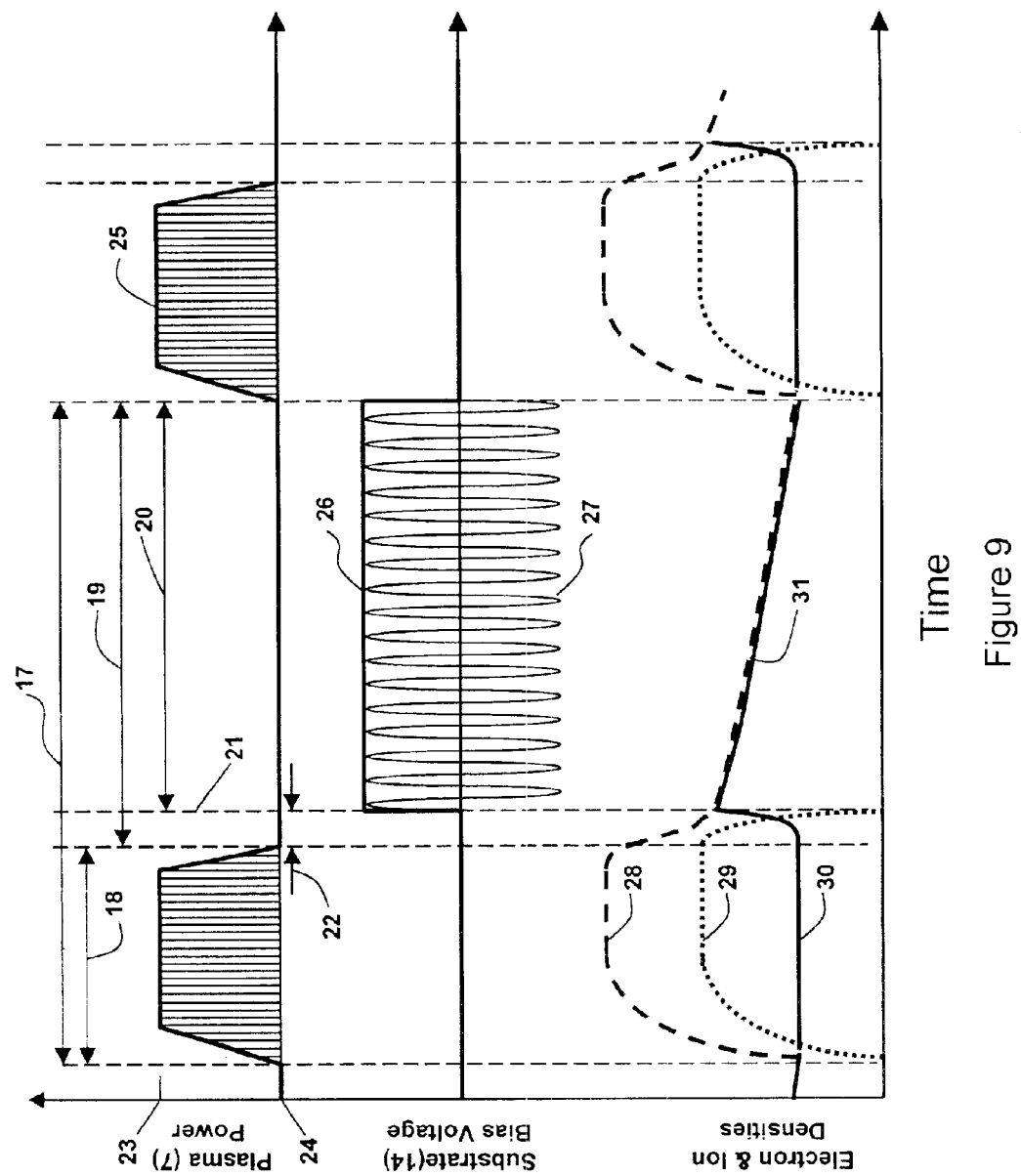
FIG. 9 illustrates the timing relationships for an alternate embodiment in which the plasma power is ramped.

FIG. 8 shows an embodiment where the polarity of the bias voltage 27B changes with each pulse 26, FIG. 9 shows an embodiment where the power pulses 25 are ramped up and down at each pulse.

Experimental Results

The present inventors have shown that temporally alternating fluxes of positive and negative ions can be brought to a substrate from ion-ion plasmas. This was achieved by applying a low-frequency bias voltage to the input aperture of a mass spectrometer during the afterglow of a $Cl_2$ discharge and observing the positive- and negative-ion signals.

The vacuum chamber consisted of a 10.2 cm (diameter) by 356 cm (length) Pyrex pipe with stainless-steel electrodes on each end. The electrode in front of the mass spectrometer has a 100 micron aperture and is isolated from ground, while the electrode at the back end of the chamber is grounded. A Faraday shielded, 11.4-cm-long, three-turn helical antenna excites a plasma midway between the electrodes. The 13.56 MHz excitation is pulsed at 1 kHz and 50% duty ratio to provide a power of 300 W during the active glow. It produces "on" (also called "activeglow") and "afterglow" times of 500 microseconds. The antennae is connected through a matching networks to an ENI A500 power amplifier. A TREK 601B-4 amplifier fills the 485 microsecond Ion-ion afterglow period with a sinusoidal voltage burst, of 9.5 cycles at 20 kHz and 225 $V_p$, applied to the mass spectrometer aperture electrode. This voltage is lower than the approximately 400 V required to ignite DC discharges in this reactor. It is what produces the alternate fluxes of positive and negative ions to the aperture electrode. Similar results were obtained with much smaller amplitude bias voltages (5 $V_p$).

The plasmas were formed in $Cl_2$ at 1 mTorr and 5 sccm, and were probed by a variety of diagnostics in addition to mass spectroscopy. Two diagnostics of interest were a time-resolved Langmuir probe and a 8.6 GHz microwave interferometer placed adjacent to the aperture electrode. The interferometer can detect down to a density of $10^8$ $cm^{-3}$. A nickel-coated aluminum strap attached to the back electrode runs along the length of the tube to provide ground reference for the Langmuir-probe measurements. It stops 8.5 cm from the mass spectrometer. The interferometer horns are positioned between the biased electrode and the ground strap to detect any electrons possibly generated by the low-frequency bias.

Figure 10:
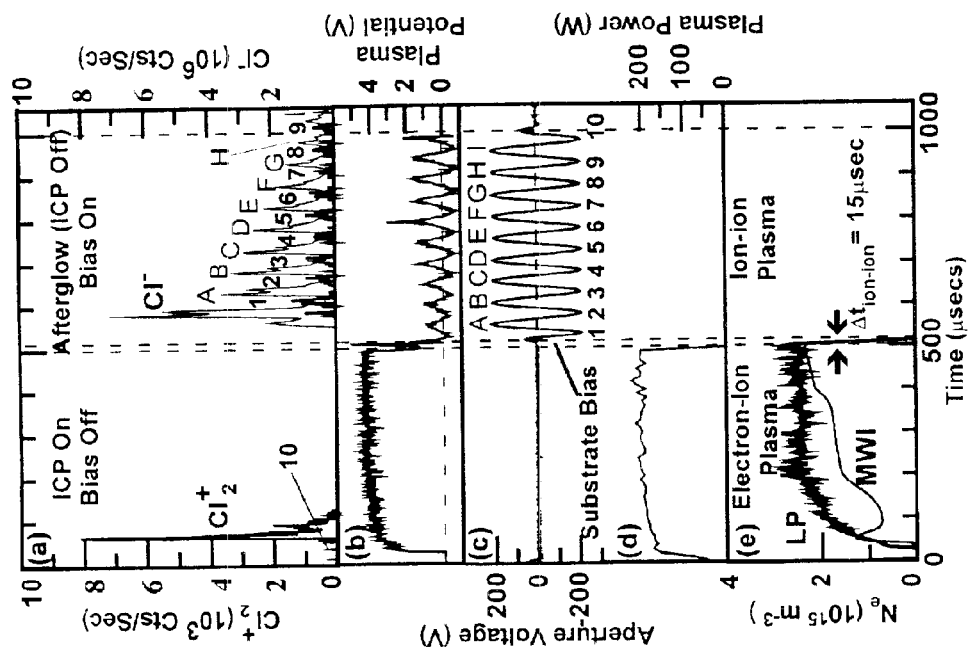
FIG. 10 illustrates test results from a specific embodiment of the invention showing alternating fluxes of positive and negative ions.

FIG. 10 is a composite of several plots showing experimental results. Experimental evidence that temporally alternating fluxes of positive and negative ions can be brought to the mass spectrometer's aperture electrode is shown in parts (a) and (b). There, the signals of positive ions ($Cl_2^+$, $Cl^+$) and negative ions ($Cl^-$) measured using the mass spectrometer have been plotted as a function of time. Alternating signals of $Cl_2^+$ and $Cl^-$ are observed during the afterglow corresponding to the appropriate phases of the aperture electrode bias.

After plasma turn off and a short delay, the first spurt of $Cl^-$ negative ions is measured by the mass spectrometer. In addition to the initial spike of $Cl^-$, nine spurts (labelled A–I) were observed, corresponding to the nine positive half cycles of bias. Interlaced spurts of $Cl_2^+$, one for each of the ten negative half cycles (1–10) are also observed. The successive peaks of both polarity ions gently decay in time as the ions are lost to extraction by the applied 20 kHz bias, ion-ion mutual neutralization, recombination and diffusion. A spurt of $Cl_2^+$ ions due to the capacitive ignition is also present.

Note the two non-idealities in part (a) of FIG. 10. First, the different transmission efficiencies for positive and negative ions of the mass spectrometer lead to a factor of 1000 difference in the $Cl_2^+$ and $Cl^-$ counts, even though equal positive- and negative-ion fluxes are expected. (The ion currents to the aperture electrode are equal and opposite.) Since the mass spectrometer is pumped to $10^{-8}$ Torr, this disparity does not seem attributable to a "lifetime" of positive ions during flight. It may be caused by differences in the ion lensing by the pinhole aperture, or in the channeltron sensitivity to the two ions. Second, the time of flight (TOF) of the ions through the long quadrupole mass filter shifts the data by approximately 50 microseconds for both $Cl^+$ and $Cl^-$. The $Cl_2^+$ spurts are shifted slightly more, due to the larger mass. The present inventors have also explained elsewhere the appearance of $Cl_2^+$ instead of $Cl^+$ due to charge exchange reactions. These instrumental limitations, however, have no bearing on the implementation and advantages of the disclosed innovations.

Part (b) of FIG. 10 shows the plasma potential as measured by the Langmuir probe. Apart from the conventional positive plasma potential in the activeglow, a sinusoidal oscillation of the plasma potential can be seen during the ion-ion plasma phase. This sinusoidal oscillation is due to the applied bias and it allows for the plasma potential to acquire negative values. This means that when a negative voltage is applied to the biased electrode and consequently positive ions are attracted, the plasma in order to eject an equal amount of negative ions to the back electrode (that is at zero potential), acquires a negative value.

One application of this is to commercial applications where the substrate may be unsuited for applying a bias through (e.g. quartz photomasks), the substrate can simply be placed on a grounded electrode, and the plasma can be biased by using a suitable conducting probe electrode. The negative excursions of plasma potential due to the application of bias to such an electrode will then allow a flux of negative ions onto the unbiased substrate.

Because of concern over whether the applied bias might generate electrons, the voltage on the mass spectrometer aperture plate is plotted in part (c) of FIG. 10. The electron-density near the aperture electrode (measured using the Langmuir probe and microwave interferometer) is plotted in part (e) of FIG. 10. Both techniques indicate negligible electron density production due to the bias. Moreover, the product of the pinhole voltage and plasma current (difference between the currents measured with and without plasma) is less than 2 VA, ruling out any significant plasma generation by the bias (see part (d)). The power is deposited into accelerating the ions instead. Finally, the present inventors note that the generation of any electrons by the bias would have likely prevented the negative-ion signal as well.

Figure 11:
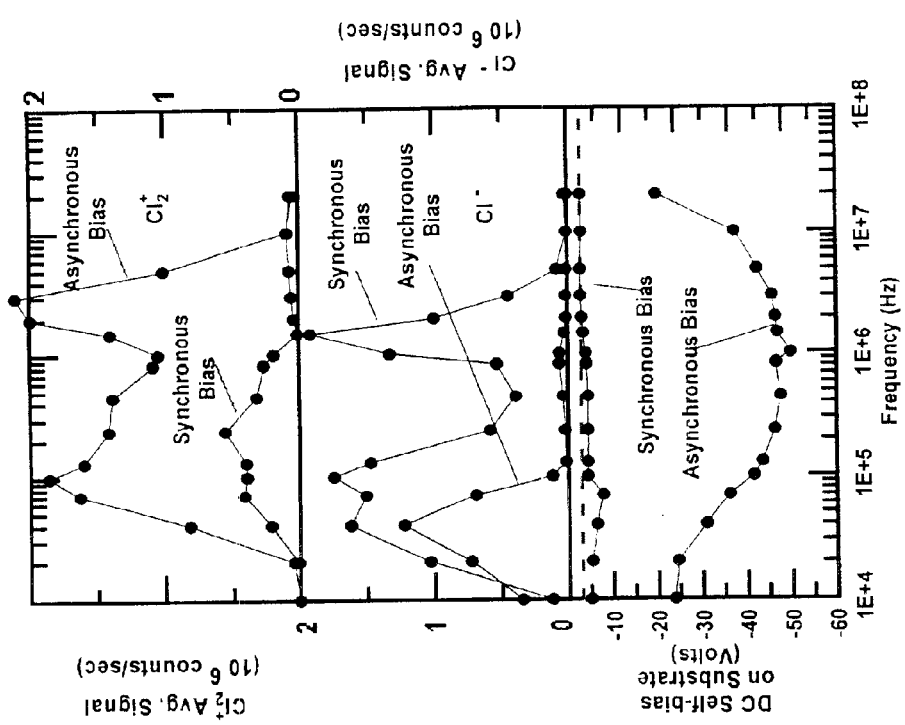
FIG. 11 illustrates test results from a specific embodiment of the invention showing how the asynchronous biasing causes a DC bias and prevents negative ions from being used in processing.

By phase-locking the envelopes of modulation for the plasma generation and bias application, the electron free ion-ion plasma is efficiently utilized. This is evidenced in the results of FIG. 11. This figure compares the innovative use of synchronous bias with asynchronous-bias techniques. The top part of this Figure shows that, over a range of bias frequencies (with a constant amplitude of 50V sinusoidal bias), the synchronous mode of bias achieves fewer positive ions extracted to the substrate. (This is expected, since waveforms like those of FIG. 2 apply bias over only a fraction of the pulse period.) However, the middle part of FIG. 11 shows that the synchronous bias technique extracts negative ions more efficiently and over a broader band of frequencies. An asynchronous bias charges the external capacitor negative by biasing during the electron-ion phase of the plasma. This external capacitance is inherent to matching networks or even modern electrostatic chucks that prevent a DC grounding of the substrate. Dielectric buried layers in the substrate can also cause the substrate to be capacitively isolated from ground. The negative charge up of the external capacitor persists during the ion-ion afterglow and repels away negative ions from the ion-ion plasma. Hence although the ion-ion plasma is capable of providing equal fluxes of negative and positive ions, lack of phase-lock between the envelopes of modulation the plasma generation and bias power that makes the bias exclusive to the ion-ion plasma can lead to reduction in negative ion extraction efficiency. The disclosed technique of ion-ion synchronous bias reduces the magnitude of negative charge build-up in the series capacitances by allowing the electron-ion phase of the plasma be unbiased (as shown in the bottom part of FIG. 11). This minimizes the DC difference between the plasma and substrate potentials, thus allowing equal fluxes of negative and positive ions.

Figure 12:
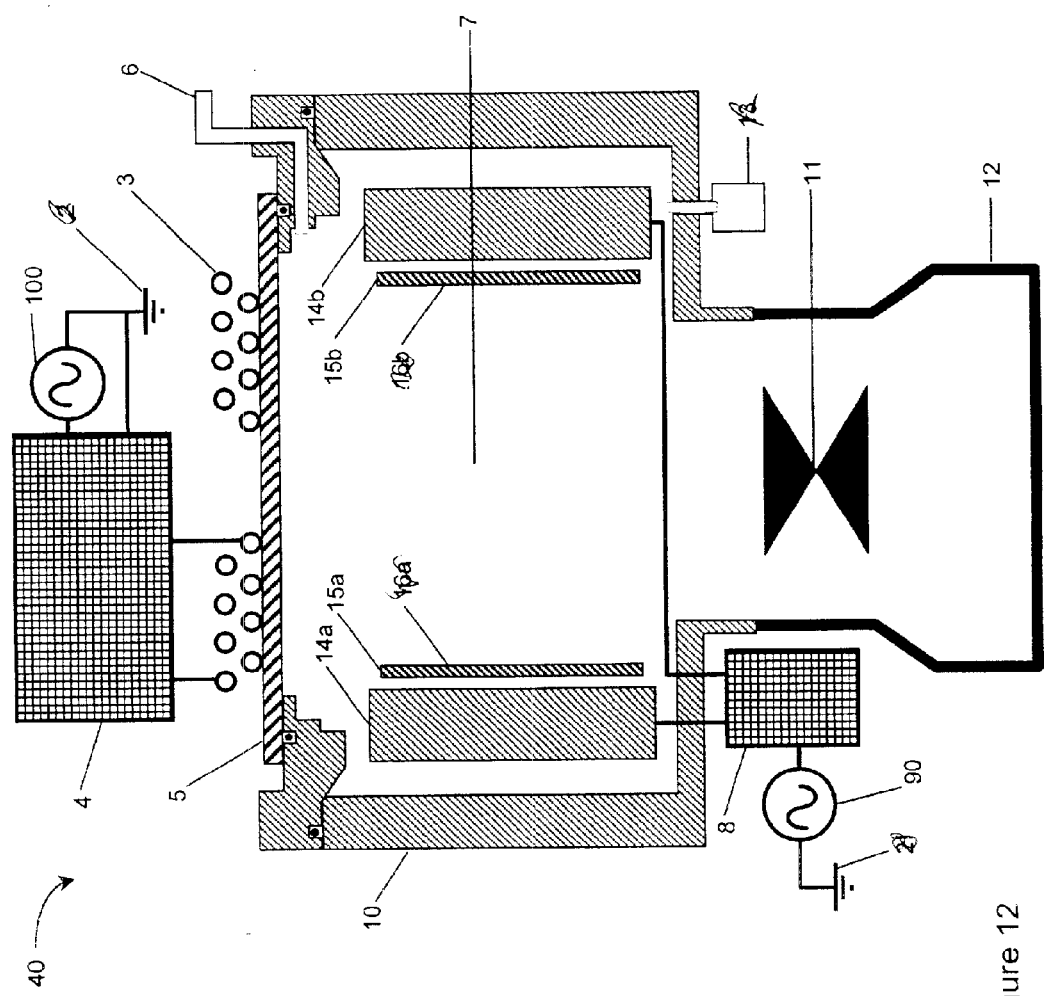
FIG. 12 shows a simplified example of a two-substrate ion-ion plasma processing system.

FIG. 12 shows a simplified example of a two-substrate ion-ion plasma processing system. In this example the bias supply 90 is shown connected to two platens 14*a/b* through a single matching network 8, but of course the matching network 8 can be configured to provide a phase offset between the two platens if desire.

Figure 13:
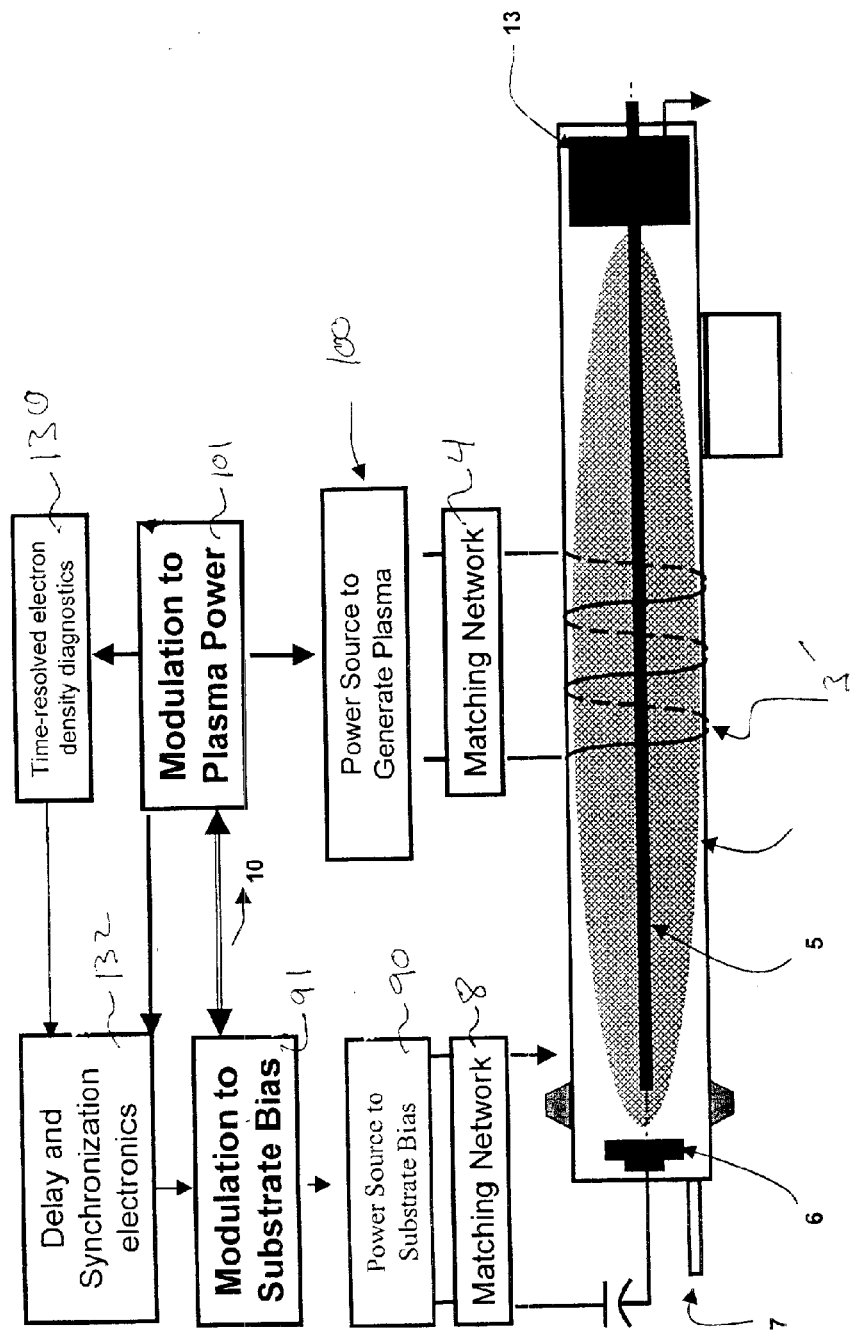
FIG. 13 is a block diagram overview of a plasma diagnostics system.

FIG. 13 is a block diagram overview of a plasma diagnostic system, showing synchronization relations. In this sample embodiment a modulation circuit 101 controls the RF power source 100, which is connected through matching network 4 to a drive coil. (In this example a helical drive coil 3' is used, instead of the planar drive coil 3 of FIG. 1.) The output of modulation circuit 101 is also used to gate an electron density detector 130, which (through delay circuit 132) activates the substrate bias modulator 91. This accordingly turns on bias power source 90 only when the electron density has become very small. Thus the synchronization relation 10 is achieved without wasting any possible etching time.

Figure 14:
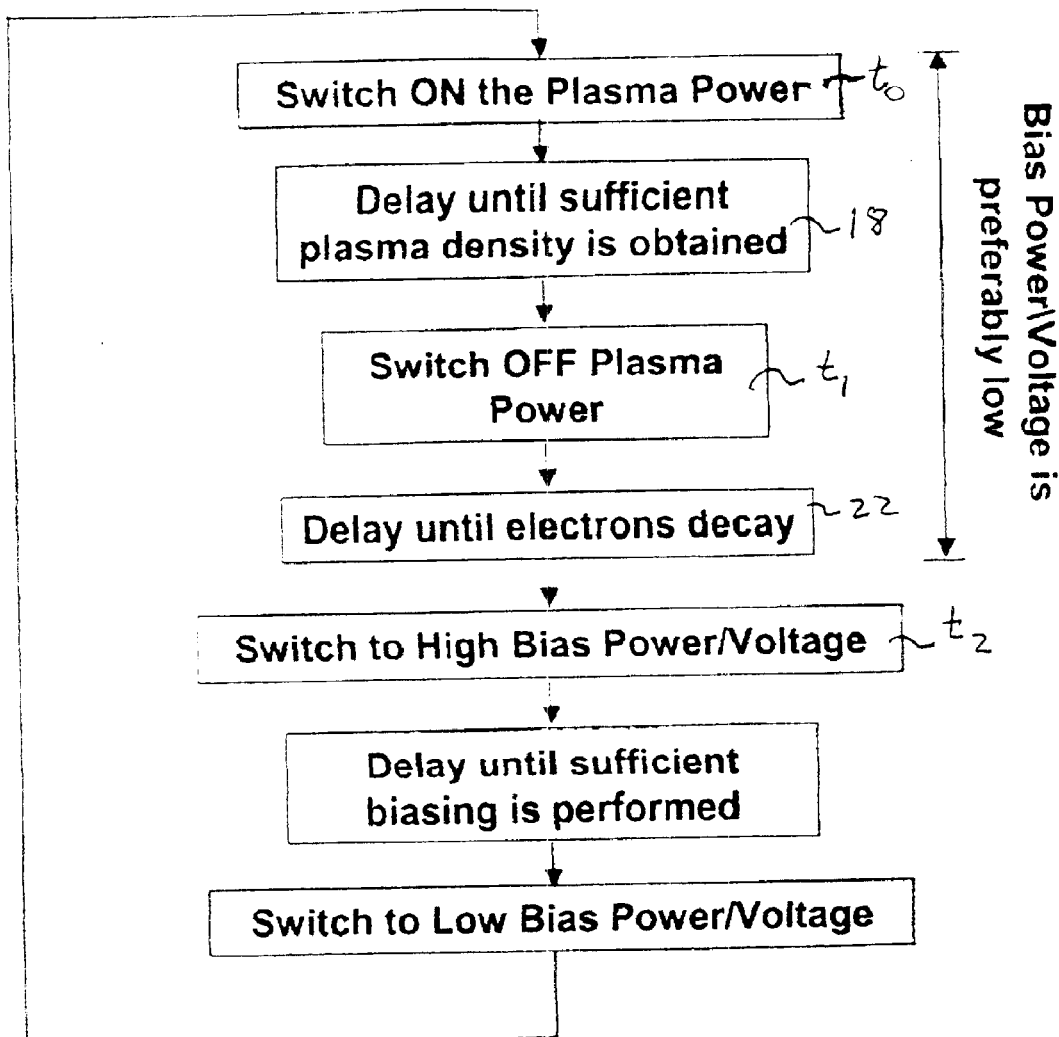
FIG. 14 is a flowchart of a process according to a sample embodiment.

FIG. 14 is a schematic flowchart of a process according to a sample embodiment. At time $t_0$ the plasma drive power is applied, and at time $t_1$ (after the ON period 18) it is ended. A delay 22 is then interposed to achieve an electron-free ion-ion plasma. During all this time the substrate power/voltage drive (i.e. bias) is preferably low. At time $t_2$ the substrate power/voltage drive is turned on, and at time $t_0'$ (after bias time period 20) it is turned off. The cycle then begins again as the plasma drive power is reapplied.

According to a disclosed class of innovative embodiments, there is provided: A method for plasma processing, comprising the actions of: generating an electron-free ion-ion plasma in proximity to at least one substrate; and controlling bias to said substrate, at times when said ion-ion plasma is present, to induce bombardment of said substrate by ions of desired polarity and energy, with substantially no electron bombardment.

According to another disclosed class of innovative embodiments, there is provided: A method for plasma processing, comprising the actions of: repeatedly applying power pulses to a chamber, to thereby increase the total ion density inside said chamber; and, AFTER one of said power pulses AND AFTER sufficient time for the free electron density to fall to less than 0.5% of the positive ion density inside said chamber, applying a bias signal to a substrate to induce bombardment of said substrate by negative ions; wherein said sufficient time substantially prevents bombardment of said substrate by free electrons.

According to another disclosed class of innovative embodiments, there is provided: A method for surface modification by negative ion bombardment, comprising the actions of: generating a population of negative ions in proximity to a substrate; and applying a bias signal to induce bombardment of said substrate by said negative ions, but only at times when said negative ions outnumber free electrons by more than 200 to 1; whereby self-biasing of said substrate is prevented.

According to another disclosed class of innovative embodiments, there is provided: A method for plasma processing, comprising the actions of: applying power pulses to a chamber, using an intensity modulation waveform, to thereby increase the total ion density in said chamber; and applying a bias signal, whose envelope is synchronized to said modulation waveform, to a substrate; wherein a delay is imposed, between at least some trailing edges of said modulation waveform and respective next leading edges of said bias signal envelope, which is sufficient for the free electron density to fall to less than 0.5% of the negative ion density inside said chamber.

According to another disclosed class of innovative embodiments, there is provided: A method for plasma processing, comprising the actions of: applying power pulses to a chamber at a first frequency, to thereby increase the total ion density in said chamber; and repeatedly applying a bias signal, at a switching frequency which is integrally related to said first frequency, to at least one substrate; wherein a delay is imposed, between at least some trailing edges of said power pulses and respective next leading edges of said bias signal, which is sufficient for the free electron density to fall to less than 0.5% of the positive ion density inside said chamber.

According to another disclosed class of innovative embodiments, there is provided: A method for plasma processing, comprising the actions of: generating an electron-free ion-ion plasma in proximity to at least first and second substrates; and applying different respective bias signals to said substrates, at times when said ion-ion plasma is present, to induce bombardment of said first substrate by ions of desired chemistry and energy, with substantially no electron bombardment, and to regulate the voltage and/or composition of said plasma by ion bombardment of said second substrate.

According to another disclosed class of innovative embodiments, there is provided: An ion-ion-plasma processing system, comprising: a chamber; circuitry which repeatedly applies power pulses to increase the total ion density of a glow discharge in said chamber; and circuitry which repeatedly applies a bias signal to a substrate, after said first circuitry has completed one of said power pulses and after sufficient time for attachment of free electrons in said glow discharge, to induce bombardment of said substrate by ions and not by electrons.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

In one class of embodiments the bias voltage is ramped. Ramped voltage gives constant energy ions (through capacitor). Most semiconductor substrates are processed on a chuck that has voltage applied to it. This voltage is most often applied to the chuck through a capacitor. In fact, the recent use of electrostatic chucks ensures that even conducting substrates have a series capacitor between the bias voltage source and the surface of the wafer. Since the plasma acts somewhat resistive, the series circuit looks similar to a series RC circuit. In this case, the voltage across the sheath can be made approximately constant by appropriately ramping the voltage on the bias voltage source. A constant sheath potential will cause the ions to have a very well defined energy since they will all fall down the same potential hill while heading into the wafer.

A particular advantage of the disclosed innovations is IEDF (Ion Energy Distribution Function) control. It is possible with this technique to control the IEDF in ways that are difficult using ordinary plasma. One can, for example, modulate the amplitude of the RF bias voltage during the ion-ion plasma, to bring in ions with low energy at the start of the ion-ion plasma phase and with large energy later as shown in FIG. 7. On the other hand, one can also bias the surface at a large positive voltage to bring in high kinetic energy negative ions and at a small negative voltage to bring in low energy positive ions as in FIG. 6. Then the negative ions might physically initiate etching because of their large kinetic energy while the positive ions come in with low kinetic energy and etch in a fashion that is less violent (i.e. more chemically and less physically damaging.)

In a further contemplated class of embodiments, an additional degree of control can be added by driving a second substrate (or electrode) within the chamber. The second substrate can be a second workpiece, or can be a material surface which serves to control the plasma chemistry. (A particularly attractive example is a sacrificial silicon wafer, in combination with etching of $SiO_2$.) The silicon probe would be biased and cause ions to fall onto the processing substrate in addition to sinking many of the Si etching radicals and thereby increasing the oxide to Si selectivity on the substrate.) FIG. 12 shows one example of such a configuration. (However, those of ordinary skill will recognize that FIG. 12 is a very simplified example, which as shown would have poor uniformity.)

For example, in one contemplated class of embodiments, bias power is merely modulated between nonzero values, rather than being switched on and off.

For example, in an alternative and less preferably contemplated modification, the RF drive power is merely modulated between nonzero values, rather than being switched totally off.

For example, in another contemplated class of embodiments, bias power is modulated in a more complex waveform, which includes intermediate values as well as on and off.

For another example, bias power can include a DC component, as well as an AC component which is at a lower frequency than the RF drive.

For another example, the bias power modulation waveform can include an offset AC component in addition to positive- and negative-going pulses.

For another example, the bias power modulation waveform can be asymmetrical (although it is preferable to balance positive and negative charge transfer, so that no net charging-up occurs).

For another example, one contemplated class of embodiments uses phase-locked bias power modulation only during the overetch period of a plasma etching process. This is especially attractive when the layer being etched is conductive. Thus the etch rate can be maximized during the period when conductive material is present to prevent charge-up, while still preventing charge-up during the period when the process is most vulnerable to this.

Note that the disclosed innovations are not limited to semiconductor processing, nor even to microfabrication. The disclosed techniques can also be used for bulk plasma processes (e.g. application of optical or superhard or other sophisticated coatings).

In another alternative, additional delay can optionally be inserted between the drop in the electron population and the start of the bias pulse, although this will degrade the net efficiency. Similarly, additional delay can be inserted between the end of a bias pulse and the start of the following power pulse.

For another example, one contemplated class of embodiments uses synchronized bias power modulation for deposition.

For another example, one contemplated class of embodiments uses synchronized bias power modulation for plasma implantation.

For another example, one contemplated class of embodiments uses synchronized bias power modulation whose frequency is harmonically related to the pulse frequency. That is, even though wafer bias drive is preferably phase-locked to the inductively-coupled plasma drive (ICP drive), the frequencies do not have to be the same. For example, if the bias pulses are alternately positive- and negative-going, the frequency of the wafer drive waveform will be one-half that of the ICP drive.

Inductively-coupled RF drive is used for plasma generation in the presently preferred embodiment, but alternatively other techniques can be used for plasma ignition and generation, including e.g. other RF coupling configurations as well as microwave, optical, or other energy transfer mechanisms.

During the electron-ion plasma phase (during which bombardment is not particularly desirable, due to the problems discussed in the Background section), the substrate is preferably unbiased. That is, it can either be grounded or allowed to float.

In a further class of alternatives, electron attachment can be accelerated, with gas compositions which are not strongly electronegative, by admixing a small fraction of a highly electronegative gas—e.g. admixing 2% $Cl_2$ into an $O_2$ source gas. This is just one of the ways to achieve a gas phase having a high net electron affinity; another technique is to use a gas mixture containing at least one gas which on decomposition produces products with high electron affinities. Another way, of course, is to use a source gas, such as a halogen, which itself has a high electron affinity.

The use of an electronegative admixture is a very powerful technique, and offers a chemistry control which is not possible otherwise. Almost any chemistry can be modified by adding small doses of an attaching (electronegative) gas to accelerate attachment of the electrons, and get to the ion-ion phase while the negative ion density is still high. Note particularly that the positive and negative ion identities can be radically different in plasma. In a $Cl_2$-source plasma the chemistries are not very different ($Cl_2^+$ versus $Cl^-$), but in an oxygen-chlorine mix, one might get $O^+$ or $O_2^+$ as the positive ions and $Cl^-$ as the negative ion. These very different chemistries can be used to adjust chemistry IN REAL TIME: by using asymmetrical voltages for the positive and negative bias pulses, one can decide almost on the fly whether it is time to oxidize the surface more or chlorinate it. This provides a huge new capability in plasma control, which cannot be changed otherwise than by gas flow changes conventionally. This can be particularly advantageous in combination with real-time and/or in-situ plasma monitoring techniques.

In another class of contemplated embodiments, the use of a Faraday Shielded ICP source is believed to combine synergistically with the ion-ion techniques described above. The Faraday Shield helps reduce capacitive voltage coupling to the plasma and thereby causes the plasma potential to be lower on average and to have much smaller swings with respect to ground. This helps reduce the energy of ions bombarding a processing substrate during the active glow and therefore to make the processing during the ion-ion plasma more important to the overall process as well as controllable. A particularly advantageous Faraday Shield design is described in a copending U.S. patent application (docket number UTD-16) of Khater and Overzet, also assigned to the University of Texas at Dallas, and which is hereby incorporated by reference.

In another class of examples, the synchronous bias power modulation is applied to the counter electrode, and the substrate of interest is allowed to receive ions as ejected by the oscillating plasma potential.

Without limiting the scope of the invention, the disclosed innovations are particularly useful in connection with plasma processing operations in the semiconductor device manufacturing industry, such as etching, depositing or otherwise modifying (reacting, chemically changing, cleaning, activating etc.) a material surface in proximity with the novel "ion-ion plasma." This new type of plasma is also known as "electron-free" plasma and generally consists of positive ions and negative ions. (For a convenient quantitative distinction, the electron density is generally at least 200 times smaller than the positive ion density.) The proper use of ion-ion plasma can greatly improve processing results.

Preferably the RF power drive waveform is phase-locked to the bias waveform, but of course frequency-locking or other synchronization techniques can be used instead.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A method for plasma processing, comprising the steps of:

generating a substantially electron-free ion-ion plasma in proximity to at least one substrate; and applying a bias signal having signal components of alternating positive and negative polarities to said substrate, at times when said ion-ion plasma is present, to induce bombardment of said substrate by both negative and positive ions.

2. The method of claim 1, wherein said plasma is generated in a chamber containing a gas phase having high net electron affinity.

3. The method of claim 1, wherein said ion-ion plasma has positive and negative charge densities that are substantially equal.

4. A method for plasma processing, comprising the steps of:
periodically applying power pulses to a chamber to selectively increase the total ion density therein; and
after a delay period following one of said power pulses, applying a bias signal having alternating positive and negative polarities to a substrate, to induce bombardment of said substrate at different times with both negative and positive ions.

5. The method of claim 4, wherein said chamber contains a gas phase having high net electron affinity.

6. The method of claim 4, wherein said pulses oscillate between a maximum level of power which increases plasma density and a nonzero minimum level which allows electron attachment.

7. The method of claim 4, wherein said bias signal is modulated at a frequency which is integrally related to the switching frequency of said power pulses.

8. The method of claim 4, wherein said power pulses are pulses of RF power.

9. The method of claim 4, wherein said power pulses are pulses of RF power.

10. The method of claim 4, wherein said power pulses are pulses of RF power, and wherein said bias signal has a frequency lower than the frequency of said power pulses.

11. The method of claim 4, wherein said bias signal is phase-locked to said power pulses.

12. The method of claim 4, wherein said delay period is selected to end at a time when electron density in said chamber has dropped below a specified threshold.

13. The method of claim 12, wherein said specified threshold for said electron density is on the order of $\frac{1}{200}^{th}$ of the positive ion density in said chamber.

14. A method for surface modification by negative ion bombardment, comprising the steps of:
generating approximately equal populations of positive and negative ions in proximity to a substrate; and
applying a bias signal having signal components of alternating positive and negative polarities, to induce bombardment of said substrate by ions of both said populations during time periods when the number of free electrons proximate to said substrate is less then a specified fraction of the number of ions in one of said populations.

15. The method of claim 14, wherein said populations are generated in a chamber containing a gas phase having high net electron affinity.

16. The method of claim 14, wherein said bias signal is applied to induce bombardment at different times with both negative and positive ions.

17. The method of claim 14, wherein said ion populations are generated by means of pulses of RF power.

18. The method of claim 14, wherein said specified fraction is $\frac{1}{200}$th.

19. A method for plasma processing, comprising the steps of:
applying power pulses defining an intensity modulation waveform to a chamber, to thereby increase the positive and negative ion densities in said chamber;
applying a bias signal having alternating positive and negative polarities to a substrate, said bias signal defining an envelope; and
imposing a delay between at least some trailing edges of said modulation waveform and the respective next leading edges of said bias signal envelope, said delay being sufficient to cause the free electron density to become less than a specified fraction of the positive ion density inside said chamber.

20. The method of claim 19, wherein said chamber contains a gas phase having high net electron affinity, and said specified fraction is 0.5%.

21. The method of claim 19, wherein said power pulses oscillate between a maximum level of power which increases plasma density and a nonzero minimum level which allows electron attachment.

22. The method of claim 19, wherein said bias signal is modulated at a frequency which is integrally related to the switching frequency of said power pulses.

23. The method of claim 19, wherein said power pulses are pulses of RF power.

24. The method of claim 19, wherein said bias signal is applied to induce bombardment at different times with both negative and positive ions.

25. The method of claim 19, wherein said power pulses are pulses of RF power, and wherein said bias signal has a frequency lower than the frequency of said power pulses.

26. The method of claim 19, wherein said bias signal is phase-locked to said power pulses.

27. A method for plasma processing, comprising the actions of:
(a.) generating an electron-free ion-ion plasma in proximity to at least first and second substrates; and
(b.) applying different respective bias signals to said substrates, at times when said ion-ion plasma is present, to induce bombardment of said first substrate by ions of desired chemistry and energy, with substantially no electron bombardment, and
to regulate the voltage and/or composition of said plasma by ion bombardment of said second substrate.

28. The method of claim 27, wherein said ion-ion plasma is generated in a chamber containing a gas phase having high net electron affinity.

29. The method of claim 27, wherein said bias signals are applied to induce bombardment at different times with both negative and positive ions.

30. The method of claim 27, wherein:
said ion-ion plasma is generated by applying power pulses to a chamber.

31. The method of claim 30, wherein said power pulses oscillate between a maximum level of power which increases plasma density and a nonzero minimum level which allows electron attachment.

32. The method of claim 30, wherein said power pulses are pulses of RF power.

* * * * *

UNITED STATES PATENT AND TRADEMARK OFFICE
CERTIFICATE OF CORRECTION

PATENT NO.        : 6,875,700 B2
APPLICATION NO.   : 09/820244
DATED             : April 5, 2005
INVENTOR(S)       : Sivananda K. Kanakasabapathy and Lawrence J. Overzet It is certified that error appears in the above-identified patent and that said Letters Patent is hereby corrected as shown below:

Col. 1, Line 10 Add the following title and paragraph after the paragraph entitled CROSS-REFERENCE TO OTHER APPLICATION:

"STATEMENT OF FEDERALLY FUNDED RESEARCH

This invention was made with Government support under grant CTS-9713262, awarded by the National Science Foundation. The Government has certain rights in this invention."

Signed and Sealed this

Eleventh Day of May, 2010

David J. Kappos
*Director of the United States Patent and Trademark Office*